US008003220B2

(12) United States Patent
Melechko et al.

(10) Patent No.: US 8,003,220 B2
(45) Date of Patent: Aug. 23, 2011

(54) NANOTRANSFER AND NANOREPLICATION USING DETERMINISTICALLY GROWN SACRIFICIAL NANOTEMPLATES

(75) Inventors: Anatoli V. Melechko, Oak Ridge, TN (US); Timothy E. McKnight, Greenback, TN (US); Michael A. Guillorn, Ithaca, NY (US); Bojan Ilic, Ithaca, NY (US); Vladimir I. Merkulov, Knoxville, TN (US); Mitchel J. Doktycz, Knoxville, TN (US); Douglas H. Lowndes, Knoxville, TN (US); Michael L. Simpson, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 366 days.

(21) Appl. No.: 11/985,395

(22) Filed: Nov. 13, 2007

(65) Prior Publication Data

US 2008/0182068 A1 Jul. 31, 2008

Related U.S. Application Data

(60) Division of application No. 11/273,316, filed on Nov. 14, 2005, now Pat. No. 7,943,196, which is a continuation of application No. 10/774,699, filed on Feb. 9, 2004, now Pat. No. 7,229,692.

(51) Int. Cl.
*B32B 9/00* (2006.01)
(52) U.S. Cl. ............ 428/446; 428/698; 428/131
(58) Field of Classification Search .......... None
See application file for complete search history.

(56) References Cited

U.S. PATENT DOCUMENTS

| | | | |
|---|---|---|---|
| 6,346,189 B1 * | 2/2002 | Dai et al. | 205/766 |
| 2002/0055239 A1 | 5/2002 | Tuominen et al. | |
| 2002/0114949 A1 | 8/2002 | Bower et al. | |
| 2002/0175323 A1 | 11/2002 | Guillom et al. | |
| 2003/0168002 A1 | 9/2003 | Zaidi | |
| 2003/0171257 A1 | 9/2003 | Stirbl et al. | |
| 2003/0219992 A1 | 11/2003 | Schaper | |
| 2004/0043219 A1 | 3/2004 | Ito et al. | |
| 2004/0175844 A1 | 9/2004 | Yang et al. | |
| 2005/0002851 A1 | 1/2005 | McElrath et al. | |

OTHER PUBLICATIONS

Bachtold, A.; Hadley, P.; Nakanishi, T.; Dekker, C. "Logic Circuits with Carbon Nanotube Transistors," *Science*, 2001, 294, pp. 1317-1320.
Chhowalla, M.; Teo, K.B.K.; Ducati, C.; Rupesinghe, N.L.; Amaratunga, G.A.J.; Ferrari, A.C.; Roy, D.; Robertson, J.; Milne, W.I. "Growth Process Conditions of Vertically Aligned Carbon Nanotubes Using Plasma Enhanced Chemical Vapor Deposition," *J. Appl. Phys.*, 2001, 90(10), pp. 5308-5317.
Delzeit, L.; Nguyen, C.V.; Stevens, R.M.; Han, J.; Meyyappan, M. "Growth of Carbon Nanotubes by Thermal and Plasma Chemical Vapour Deposition Processes and Applications in Microscopy," *Nanotechnology*, 2002, 13, pp. 280-284.

(Continued)

*Primary Examiner* — Timothy M Speer
(74) *Attorney, Agent, or Firm* — Brinks Hofer Gilson & Lione

(57) ABSTRACT

Methods, manufactures, machines and compositions are described for nanotransfer and nanoreplication using deterministically grown sacrificial nanotemplates. An apparatus, includes a substrate and a nanoreplicant structure coupled to a surface of the substrate.

16 Claims, 10 Drawing Sheets

OTHER PUBLICATIONS

Guillorn, M.A.; McKnight, T.E.; Melechko, A.; Merkulov, V.I.; Britt, P.F.; Austin, D.W.; Lowndes, D.H.; Simpson, M.L. "Individually Addressable Vertically Aligned Carbon Nanofiber-Based Electrochemical Probes." *J. Appl. Phys.*, 2002, 91(6), pp. 3824-3828.

Guillorn, M.A.; Melechko, A.V.; Merkulov, V.I.; Ellis, E.D.; Britton, C.L.; Simpson, M.L.; Lowndes, D.H.; Baylor, L.R. "Operation of a Gated Field Emitter Using an Individual Carbon Nanofiber Cathode," *Appl. Phys. Lttrs.*, 2001, 79(21), pp. 3506-3508.

Harnett, C.K.; Coates, G.W.; Craighead, H.G. "Heat-Depolymerizable Polycarbonates as Electron Beam Patternable Sacrificial Layers for Nanofluidics," *J. Vac. Sci. Technol. B*, 2001, 19(6), pp. 2842-2845.

Huang, Y.; Duan, X.; Cui, Y.; Lauhon, L.J.; Kim, K-H.; Lieber, C.M. "Logic Gates and Computation from Assembled Nanowire Building Blocks," *Science*, 2001, 294, pp. 1313-1320.

Kim, P.; Lieber, C.M. "Nanotube Nanotweezers," *Science*, 1999, 286, pp. 2148-2150.

Kim, S.H.; Woo, S-G; Ahn, J. "Effects of SF6 Addition to O2 Plasma on Polyimide Etching," *Jpn. J. Appl. Phys. Part 1*, 2000, 39(12B), Abstract (2 pages).

Li, J.; Stein, D.; McMullan, C.; Branton, D.; Aziz, M.J.; Golovchenko, J.A. "Ion-Beam Sculpting at Nanometre Length Scales," *Nature*, 2001, 412, pp. 166-169.

Martin, C.R. "Nanomaterials: A Membrane-Based Synthetic Approach," *Science*, 1994, 266, pp. 1961-1966.

Melechko, A.V.; McKnight, T.E.; Guillorn, M.A.; Merkulov, V.I.; Ilic, B.; Doktycz, M.J.; Lowndes, D.H.; Simpson, M.L. "Vertically Aligned Carbon Nanofibers as Sacrificial Templates for Nanofluidic Structures," *Appl. Phys. Ltrs.*, 2003, 82(6), pp. 976-978.

Merkulov, V.I.; Lowndes, D.H.; Wei, Y.Y.; Eres, G.; Voelkl, E. "Patterned Growth of Individual and Multiple Vertically Aligned Carbon Nanofibers," *Appl. Phys. Ltrs.*, 2000, 76(24), pp. 3555-3557.

Merkulov, V.I.; Melechko, A.V.; Guillorn, M.A.; Lowndes D.H.; Simpson, M.L. "Alignment Mechanism of Carbon Nanofibers Produced by Plasma-Enhanced Chemical-Vapor Deposition," *Appl. Phys. Ltrs.*, 2001, 79(18), pp. 2970-2972.

Miller, S.A.; Young, V.Y.; Martin, C.R. "Electroosmotic Flow in Template-Prepared Carbon Nanotube Membranes," *J. Am. Chem. Soc.*, 2001, 123, pp. 12335-12342.

Qin, Z.X.; Chen, Z.Z.; Zhang, H.X.; Ding, X.M.; Hu, X.D.; Yu, T.J.; Tong, Y.Z.; Zhang, G.Y. "Effect of $O_2/CHF_3$ Plasma Treatment on n-Type GaN Grown on Sapphire by MOCVD," *Materials Science in Semiconductor Processing*, 2002, 5(6), Abstract (2 pages).

Ren, Z.F.; Huang, Z.P.; Xu, J.W.; Wang, J.H.; Bush, P.; Siegal, M.P.; Provencio, P.N. "Synthesis of Large Arrays of Well-Aligned Carbon Nanotubes on Glass," *Science*, 1998, 282, pp. 1105-1107.

Sun, L.; Crooks, R.M. "Single Carbon Nanotube Membranes: A Well-Defined Model for Studying Mass Transport Through Nanoporous Materials," *J. Am. Chem. Soc.*, 2000, 122, pp. 12340-12345.

Vo-Dinh, T.; Cullum, B.; Griffon, G.D. "Extended Abstracts," *Radiation Research*, 2001, 156, pp. 434-445.

Zeng, S.; Chen, C-H.; Mikkelsen, Jr., J.C.; Santiago, J.G. "Fabrication and Characterization of Electroosmotic Micropumps," *Sensors and Actuators B*, 2001, 79, pp. 107-114.

Melechko, A.V.; McKnight, T.E.; Guillorn, M.A.; Austin, D.W.; Ilic, B.; Merkulov, V.I.; Doktycz, M.J.; Lowndes, D.H.; Simpson, M.L. "Nanopipe Fabrication Using Vertically Aligned Carbon Nanofiber Templates," *J. Vac. Sci. Technol. B*, 2002, 20, pp. 2730-2733.

\* cited by examiner

FIG. 1a
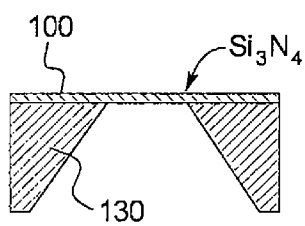
FIG. 1b
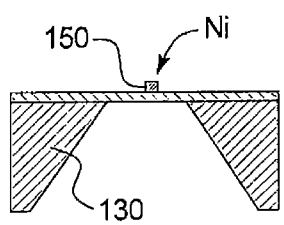
FIG. 1c
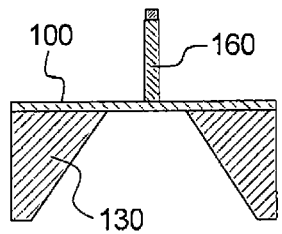
FIG. 1d
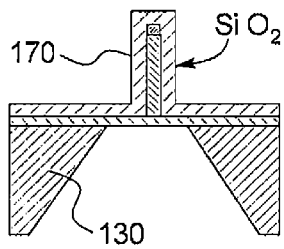
FIG. 1e
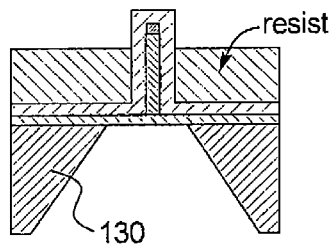
FIG. 1f
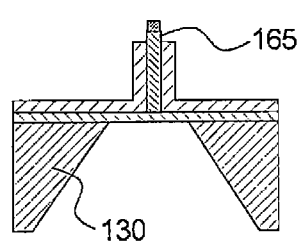
FIG. 1g
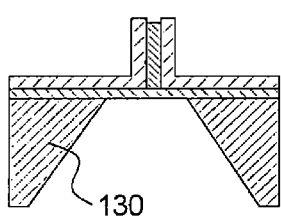
FIG. 1h
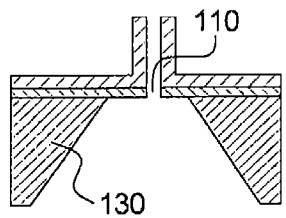
FIG. 1i

NANOTRANSFER AND NANOREPLICATION USING DETERMINISTICALLY GROWN SACRIFICIAL NANOTEMPLATES

CROSS-REFERENCES TO RELATED APPLICATIONS

This application is a divisional of, and claims a benefit of priority under 35 U.S.C. 120 from utility patent application U.S. Ser. No. 11/273,316, filed Nov. 14, 2005 now U.S. Pat. No. 7,943,196 which in-turn is a continuation of U.S. Ser. No. 10/774,699, filed Feb. 9, 2004 (now U.S. Pat. No. 7,229,692, issued Jun. 12, 2007) the entire contents of both of which are hereby expressly incorporated herein by reference for all purposes.

STATEMENT AS TO RIGHTS TO INVENTIONS MADE UNDER FEDERALLY-SPONSORED RESEARCH OR DEVELOPMENT

This invention was made with United States Government support under prime contract No. DE-AC05-00OR22725 to UT-Battelle, L.L.C. awarded by the Department of Energy. The Government has certain rights in this invention.

BACKGROUND OF THE INVENTION

1. Field of the Invention

The invention relates generally to the field of nanofabrication. More particularly, the invention relates to nanotransfer and nanoreplication using deterministically grown sacrificial nanotemplates.

2. Discussion of the Related Art

The fabrication of devices that function on the nanometer scale requires new approaches when standard microfabrication techniques cannot be scaled down. One such approach, the use of the materials such as carbon nanotubes and carbon nanofibers that self-assemble into nanostructures, has-been successfully applied in nanoelectronics. For example in electronics, use of carbon nanotubes has been suggested for the fabrication of nanowires and nanotransistors[1, 2]. The structural and dimensional properties of nanotubes can be exploited in scanning probe applications and in more exotic application such as nanotweezers[17]. Vertically aligned carbon nanofibers (VACNFs) that can be synthesized highly deterministically[3-6], have been utilized in a variety of nanodevices such as VACNF-based electrochemical probes designed for intracellular characterization[7] or gated cathode field emitters[8].

Meanwhile, porous nanostructures and hollow nanostructures continue to be developed. A nanofabrication approach that has been proposed for construction of nanofluidic devices is to use templates made of sacrificial materials that are defined by electron beam lithography[9]. However, this approach is necessarily limited to the fabrication of nanostructures having shapes that can be defined by electron beam lithography.

What is needed is a more efficient approach to the construction of nanostructures (e.g., nanofluidic devices), especially arrays of such devices. What is also needed is an approach that allows the construction of elongated nanostructures, especially elongated nanostructures that are aligned perpendicular to a substrate or at a deterministic angle to the substrate.

SUMMARY OF THE INVENTION

There is a need for the following aspects of the invention. Of course, the invention is not limited to these aspects.

According to an aspect of the invention, a process comprises: depositing a catalyst particle on a surface of a substrate to define a deterministically located position; growing an aligned elongated nanostructure on the substrate, an end of the aligned elongated nanostructure coupled to the substrate at the deterministically located position; coating the aligned elongated nanostructure with a conduit material; removing a portion of the conduit material to expose the catalyst particle; removing the catalyst particle; and removing the elongated nanostructure to define a nanoconduit. According to another aspect of the invention, a manufacture comprises: substrate and a nanoconduit material coupled to a surface of the substrate, wherein the substrate defines an aperture and the nanoconduit material defines a nanoconduit that is i) contiguous with the aperture and ii) aligned substantially non-parallel to a plane defined by the surface of the substrate. According to another aspect of the invention, a manufacture comprises: a substrate and a nanoreplicant structure coupled to a surface of the substrate.

These, and other, aspects of the invention will be better appreciated and understood when considered in conjunction with the following description and the accompanying drawings. It should be understood, however, that the following description, while indicating various embodiments of the invention and numerous specific details thereof, is given by way of illustration and not of limitation. Many substitutions, modifications, additions and/or rearrangements may be made within the scope of the invention without departing from the spirit thereof, and the invention includes all such substitutions, modifications, additions and/or rearrangements.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore nonlimiting, embodiments illustrated in the drawings, wherein identical reference numerals (if they occur in more than one view) designate the same elements. The invention may be better understood by reference to one or more of these drawings in combination with the description presented herein. It should be noted that the features illustrated in the drawings are not necessarily drawn to scale.

FIGS. 1a-1i illustrate steps for fabrication of nanopipes on a thin membrane: (FIG. 1a) $Si_3N_4$ membrane on Si substrate with backside-etched window; (FIG. 1b) Ni particles are created via e-beam lithography and lift-off technique; (FIG. 1c) VACNFs are grown by plasma enhanced chemical vapor deposition; (FIG. 1d) the VACNFs and substrate are coated with $SiO_2$; (FIG. 1e) resist is spun on; (FIG. 1f) $SiO_2$ is removed from the tips by reactive ion etching and the remaining resist is removed; (FIG. 1g) the Ni particle is removed in an $HNO_3$ wet etch; (FIG. 1h) the carbon nanofiber is etched away in an $O_2$ plasma; (FIG. 1i) the $Si_3N_4$ membrane is etched from the front side, through the nanopipes, by reactive ion etching, representing an embodiment of the invention.

(FIG. 3a) VACNF incased in $SiO_2$ (80 nm); (FIG. 3b) $SiO_2$ encapsulation is opened at the tips; (FIG. 3c) after the Ni particle is removed by HNO3; (FIG. 3d) the VACNF is etched out from inside the nanopipe, representing an embodiment of the invention.

(FIG. 4a) side view at 30°; (FIG. 4b) top view (nanopipe side); (FIG. 4c) bottom view ($Si_3N_4$ membrane side); note that each of the two nanopipes acts faithfully as a mask during the etching-through step, representing an embodiment of the invention.

(FIG. 5a) A dry array of nanopipes viewed in white light illumination; (FIG. 5b) and (FIG. 5c) fluorescence images taken 1 and 3 min after application of propidium iodide and DNA solutions, respectively; (FIG. 5d) fluorescent plumes subsided and uniform fluorescent background was observed; (FIG. 5e) after washing in deionized water and rewetting with propidium iodide and DNA (the plume appeared from the nanopipe displayed in FIGS. 3a-3c); (FIG. 5f) the plume is subsided after 3 min; (FIG. 5g) and (FIG. 5h) fluorescence images taken 1 and 3 min after 5V was applied to the solution between opposite sides of the membrane, respectively; (FIG. 5i) the plumes stopped after 5 min, representing an embodiment of the invention.

(FIG. 6a) Ni particles are created via EBL and lift-off technique; (FIG. 6b) VACNF grown by PE CVD; (FIG. 6c) VACNFs and substrate are coated with $SiO_2$ by PECVD; (FIG. 6d) resist is spun on and the VACNF tips are opened; (FIG. 6e) $SiO_2$ is removed from the tips by RIE; (FIG. 6f) Ni particle is removed in $HNO_3$ wet etch; (FIG. 6g) VACNF is etched away in $O_2$ plasma, representing an embodiment of the invention.

(FIG. 8a) an isolated VACNF encased in $SiO_2$ (80 nm); (FIG. 8b) an enlarged view of two VACNFs coated with $SiO_2$ with Ni nanoparticle visible as a bright spot; (FIG. 8c) encapsulation is opened at the tips and part of the VACNF is removed (slightly darker area in the along the VACNF axes); (FIG. 8d) the VACNF is partially etched out from inside the nanopipe, representing an embodiment of the invention.

DESCRIPTION OF PREFERRED EMBODIMENTS

Figures 2A, 2B:
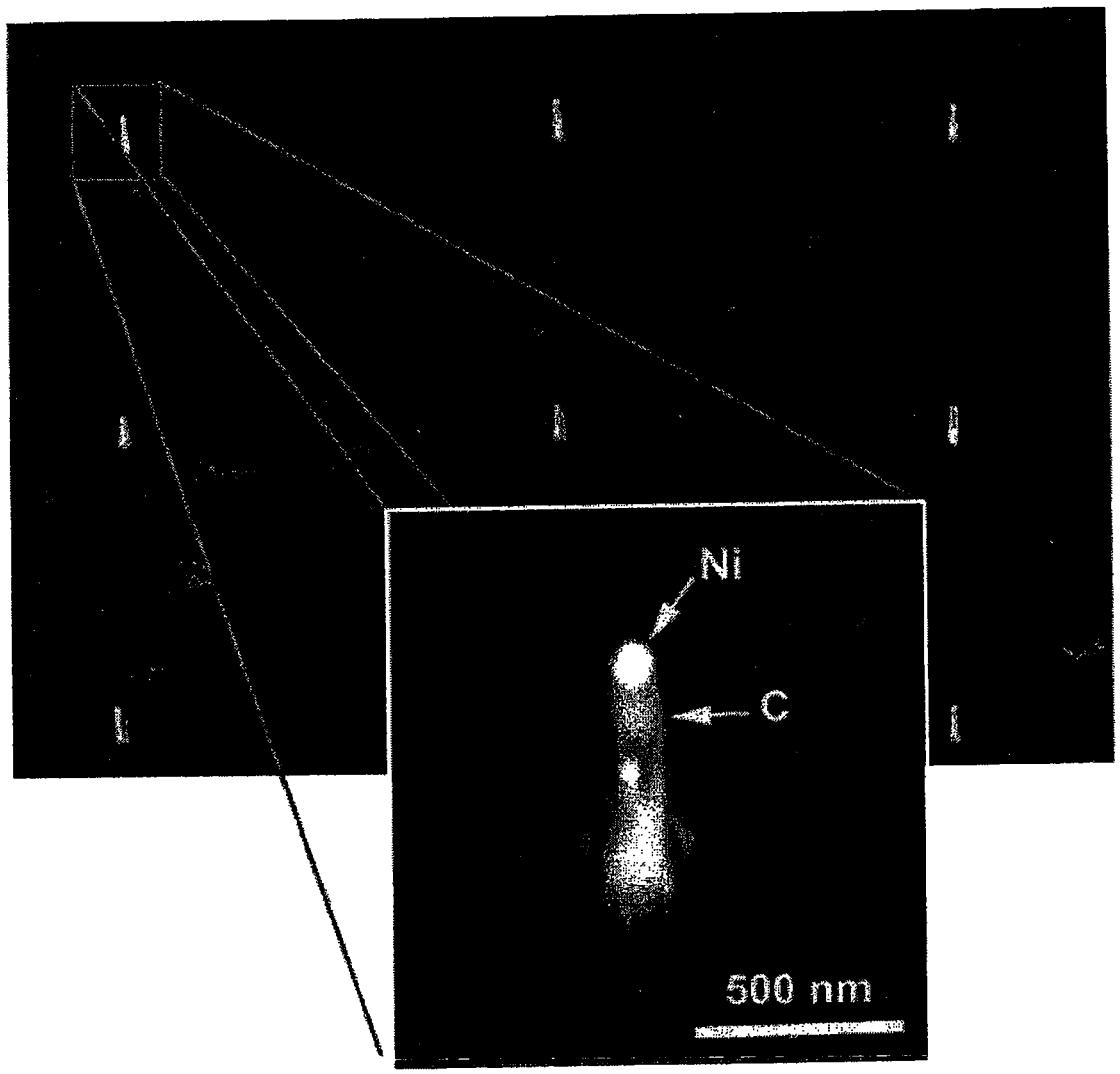
FIGS. 2a-2b illustrate scanning electron micrographs of an array of VACNFs grown on top of a $Si_3N_4$ membrane (30° view, 10 um spacing, 1 µm average height, 100 nm diameter); the evaporated Ni catalyst dots were sufficiently large that most of them separated into two distinct nanoparticles during sintering at 700° C., so that two VACNFs were grown at most locations, representing an embodiment of the invention.

The invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the invention in detail. It should be understood, however, that the detailed description and the specific examples, while indicating preferred embodiments of the invention, are given by way of illustration only and not by way of limitation. Various substitutions, modifications, additions and/or rearrangements within the spirit and/or scope of the underlying inventive concept will become apparent to those skilled in the art from this disclosure.

Within this application several publications are referenced by Arabic numerals, or principal author's name followed by year of publication, within parentheses or brackets. Full citations for these, and other, publications may be found at the end of the specification immediately preceding the claims after the section heading References. The disclosures of all these publications in their entireties are hereby expressly incorporated by reference herein for the purpose of indicating the background of the invention and illustrating the state of the art.

The below-referenced U.S. patent(s) and U.S. patent application(s) disclose embodiments that are useful for the purposes for which they are intended. The entire contents of U.S. Pat. No. 6,649,431, issued Nov. 18, 2003 are hereby expressly incorporated by reference herein for all purposes. The entire contents of U.S. Ser. No. 09/810,531, filed Mar. 15, 2001 (U.S. Pat. No. 6,692,324 to be issued Feb. 17, 2004); 10/715,057, filed Nov. 17, 2003; 09/964,270, filed Sep. 26, 2001; 10/068,795, filed Feb. 6, 2002; 10/155,841, filed May 24, 2002; 10/681,565, filed Oct. 8, 2003; 10/408,294, filed Apr. 7, 2003 and 10/716,770, filed Nov. 19, 2003 are hereby expressly incorporated by reference herein for all purposes.

Overview

The invention can include a method of nanotransfer to fabricate nanoconduits, nanopores and/or nanonegatives based on the use of deterministically grown (e.g., elongated) nanostructures that are used as sacrificial templates. The invention can include the use of primary sacrificial templates, and secondary sacrificial templates. Preferred embodiments of the invention can utilize self assembling nanostructures for the primary templates.

The invention can include the use of VACNFs as a sacrificial template for nanopipes. In this case, the invention can exploit two main properties of VACNFs: (1) their unique geometrical characteristics and (2) the ability of carbon to form volatile species ($CO_2$ and CO) in oxygen plasma that provides high selectivity of etching. For instance, the invention can include a method to fabricate tubular nanostructures (i.e., an example of a nanoconduit) by initially growing elongated nanostructures of circular cross-section (e.g., VACNFs) that are then conformally coated with $SiO_2$ and then removed (e.g., by etching), leaving the hollow tubular nanostructures.

The invention can include a method of nanoreplication to fabricate nanostructures. In more detail, the shape of nanostructures, such as carbon nanofibers, can be transferred by sacrifical templating into nanoconduits, such as $SiO_2$ nanopipe(s), and then the original shape of the elongated nanostructues can be replicated secondarily into, for example, nanorod(s) made of metals such as Au, Ni, etc. that are formed by depositing (back-filling) the metals into the nanoconduits. In this way, nanotransfer and/or nanoreplication is enabled based on the ability to deterministically grow an initial nanostructure that is subsequently selectively removed with respect to the nanonegative (e.g., nanoconduits) material, and then replaced (replicated) with another (back-fill) material. It can be appreciated that selective removal of the nanoconduit material with respect to the back-fill material enables additional subsequent (sub)cycles of nanotransfer and/or nanoreplication. Thus, the invention can include the use of self-assembled nanostructures to produce other nanostructures that cannot be produced by self-assembly methods.

The invention can include the use of nanostructured materials other than carbon as the template(s). For example, silicon nanowires can be used as the template(s) instead of carbon nanofibers, while $SiO_2$ can continue to be used as the conduit material. In this case, a silicon etch recipe (process) should be used that is selective with respect to the $SiO_2$ material of the nanopipes.

The invention can include the use of materials other than $SiO_2$ for the nanopipes (conduit material). For example, $Si_3N_4$ can be conformally deposited over carbon nanofiber(s) using PECVD instead of conformally depositing $SiO_2$. Alternatively, metal(s) can be sputtered conformally over carbon nanofiber(s) instead of conformally depositing $SiO_2$.

The invention can include the fabrication of nanoscale pipes (which can be termed "nanopipes") that are useful for fluidic transport. The invention can include the use of carbon nanofibers as sacrificial templates for nanopipes, which are extended hollow structures that can be as long as approximately a few micrometers with internal diameters ranging from approximately 200 nm down to approximately 30 nm. Vertically aligned carbon nanofibers grown by plasma-enhanced chemical vapor deposition can be used as a template for nanopipes with internal diameters ranging from approximately 30 nm to approximately 200 nm and lengths up to approximately several micrometers that are oriented perpendicular to the substrate. It is important to note that these VACNFs can be deterministically positioned (and/or orientated) on a substrate and arranged into singular devices or arrays. Please see U.S. Pat. No. 6,649,431, issued Nov. 18, 2003; U.S. Pat. No. 6,692,324 issued Feb. 17, 2004; 10/715,057, filed Nov. 17, 2003; 09/964,270, filed Sep. 26, 2001; 10/068,795, filed Feb. 6, 2002; 10/155,841, filed May 24, 2002; 10/681,565, filed Oct. 8, 2003; 10/408,294, filed Apr. 7, 2003 and 10/716,770, filed Nov. 19, 2003.

The nanopipes of the invention can be implemented as functional elements in gas- and liquid-phase fluidic devices. The invention can include devices based on such structures that provide high-throughput sensing and analysis of molecular species and fluidic interfaces to live cells. The ability to probe, control and manipulate an intact living cell has tremendous importance for science and technology. It still remains a considerable challenge due to microscopic dimensions of the object. Feature size of devices that allow interface to a live cell should be at least an order of magnitude smaller than a cell. Thus, functional elements of such devices, which provide electrical, fluidic, or optical access to a cell, should have sizes at least smaller than a few hundred nanometers. Pulled micropipette and nanopipette methods have been very successfully implemented for many cytological and biomedical applications[11]. Compared to pulled micropipettes, which are single element probing devices, the fabrication of nanopipes can be integrated in a parallel manner into microchip fabrication and lab-on-a-chip devices. Nanopipe based devices can be used for molecular control as nanoporous membranes[10,12] with very good control of the nanopore geometry. Due to catalyst control (i.e., the ability to deterministically locate the catalyst particles on the substrate), the nanopipe-nanopores can be deterministically created with controlled location, number (e.g. array or single) length and internal diameter. Additionally, the nanoconduits can be deterministically orientated at a non-normal angle to the surface of the substrate due to growth in a controlled electric field.

Such level of control of nanopipe fabrication is mainly due to the ability to deterministically grow vertically aligned carbon nanofibers (VACNF)[18]. VACNFs that are a few tens of the nanometers in diameter and up to several microns long can be catalytically grown by plasma enhanced chemical vapor deposition (PECVD). The position of each nanofiber can be defined by patterning catalyst using photo- or electron beam lithography (EBL) and their orientation is determined by the electric field lines direction during growth process.

Nanotransfer (Primary Templates)

The fabrication of nanoscale $SiO_2$ pipes ("nanopipes") suitable for fluidic transport will now be described in detail. Vertically aligned carbon nanofibers grown by plasma-enhanced chemical vapor deposition can be used as sacrificial templates for nanopipes with internal diameters as small as 30 nm and lengths up to several micrometers that are oriented perpendicular to the substrate. This method provides a high level of control over the nanopipe location, number, length, and diameter, permitting them to be deterministically positioned on a substrate and arranged into arrays.

The invention can combine the deterministically grown VACNF approach with the sacrifical template approach through the use of carbon nanofibers as self-assembled sacrificial templates for the synthesis of nanopipes, which are extended hollow structures that can be as long as a few micrometers with internal diameters as small as 30 nm. Such nanopipes can be implemented as functional elements in gas- and liquid-phase fluidic devices. Several applications of nanopipes can be envisioned including high-throughput sensing, analysis of molecular species[10], and fluidic interfaces to live cells. Compared to conventional pulled micropipettes[11], which are single-element probing devices, the fabrication of nanopipes can be integrated in a parallel manner into microchip fabrication and lab-on-a-chip devices. Nanopipe-based devices may be used as nanoporous membranes[12-14] for molecular control as they can be synthesized with very good control of the nanopore geometry. The ability to define the nanopipe location, direction, number (e.g. array or single), length and internal diameter is mainly provided by the ability to deterministically grow vertically aligned carbon nanofibers[3].

An exemplary nanopipe fabrication process is depicted in FIGS. 1a-1i. Thin (80 nm) low-stress $Si_3N_4$ membranes 100 were used as a substrate so that the access holes 110 to the nanopipes 120 could be opened from the backside of the chip[9] (see FIG. 1a). In more detail, an 80 nm low-stress silicon nitride layer was deposited on both sides of a double polished silicon wafer 130 by low-pressure chemical vapor deposition (LPCVD). Windows were opened in the nitride by $SF_6$ plasma etching through a photoresist mask on the back side of the wafer. The wafer was then etched in KOH until the etch stopped at the nitride film on the front side (see FIG. 1a).

Electron beam lithography was used to define catalyst sites for deterministic growth of VACNFs (see FIG. 1b). In more detail, the catalyst particles 150 were deposited using the lift off method (see FIG. 1b). Electron beam resist, poly(methyl methacrylate) (PMMA), was spun on the top surface and dot patterns (10 um spaced dots on a square grid) were exposed over the areas above membranes. The exposures were developed in a solution of MIBK:isopropanol 1:1 for 1 min, rinsed in isopropanol and blown dry with nitrogen. The catalyst metal (Ni, 100 A) was deposited by electron gun physical vapor deposition (PVD). The resist was then dissolved in acetone so that the metal remained only on the exposed (free from the resist) dots.

The nanofibers 160 were grown (see FIG. 1c) in the glow discharge dc plasma of an ammonia/acetylene gas mixture at 700° C.[3], with 2.5 Torr total pressure and 150 mA dc current. A scanning electron microscope (SEM) image of the resultant array of fibers is shown in FIG. 2.

Figure 3A:
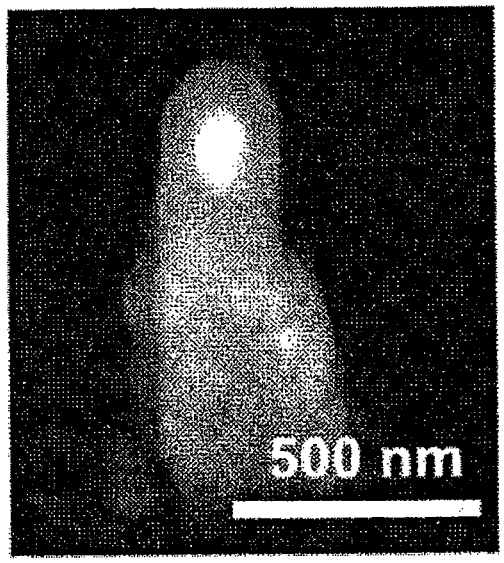
FIGS. 3a-3d illustrate scanning electron micrograph images of nanopipes along the fabrication process.

In the next step (see FIG. 1d) the nanopipe walls 170 were formed by coating the nanofibers 160 and chip surface with a 100-nm-thick layer of $SiO_2$ using a silane-based plasma enhanced chemical vapor deposition process (see also FIG. 3a).

Figure 3B:
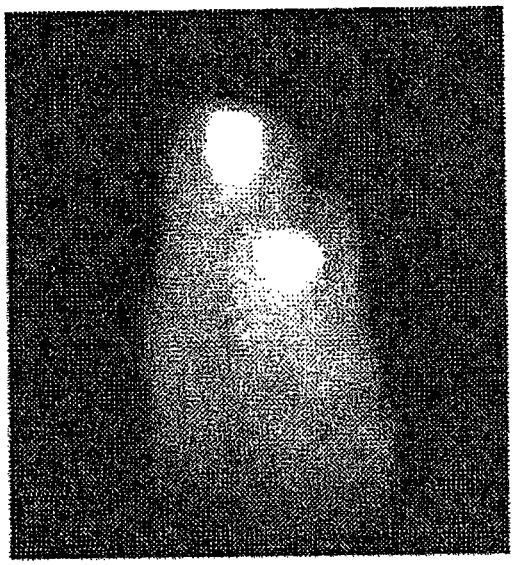

Resist was then spun-on and the tips of the nanopipes were opened by reactive ion etching. In more detail, to open the tips of the nanopipes (see FIG. 1f) first the resist was spun over the surface of the chip (Shipley, Microposit 1818) and its thickness was adjusted using reactive ion etching (RIE) in oxygen plasma to uncover the tips 165 of the nanopipe structures. The silicon oxide was removed from exposed areas using RIE in $CHF_3/O_2$ RF (radio frequency) plasma (see also FIG. 3b). The resist was then dissolved in acetone or alternatively etched in RIE oxygen based plasma. The latter method is preferable since it uncovers the catalyst particle 150 from a carbon film that forms during VACNF growth process.

Figure 3C:
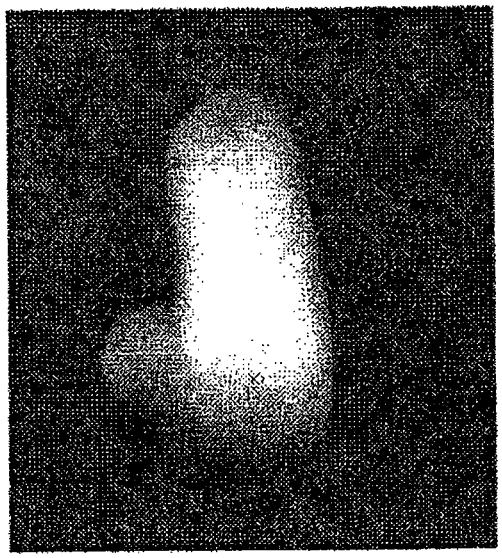
Figure 3D:
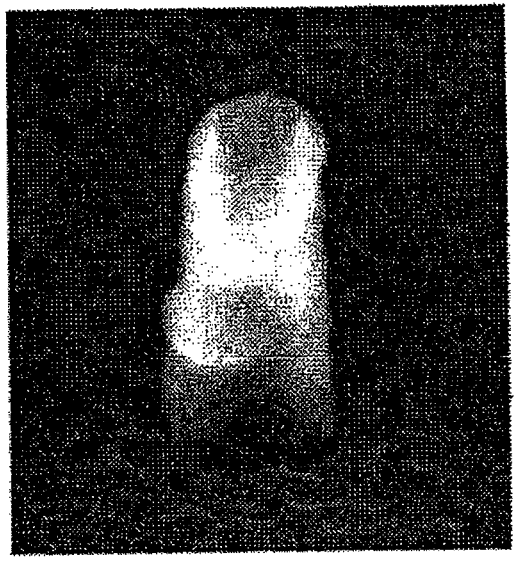

The Ni particle 160 was removed in nitric acid, providing access to the carbon nanofiber (see FIGS. 1e, 1f, and 1g), that was successively etched away from the nanopipe interior in an oxygen plasma (see FIG. 1h). In more detail, a 1 minute dip in nitric acid was used to remove the Ni particle that blocks the way to the body of a VACNF (see FIG. 1g and FIG. 3c). Then, the VACNF was etched away from inside the nanopipe in oxygen plasma (see FIG. 1h and FIG. 3d).

Figure 4A:
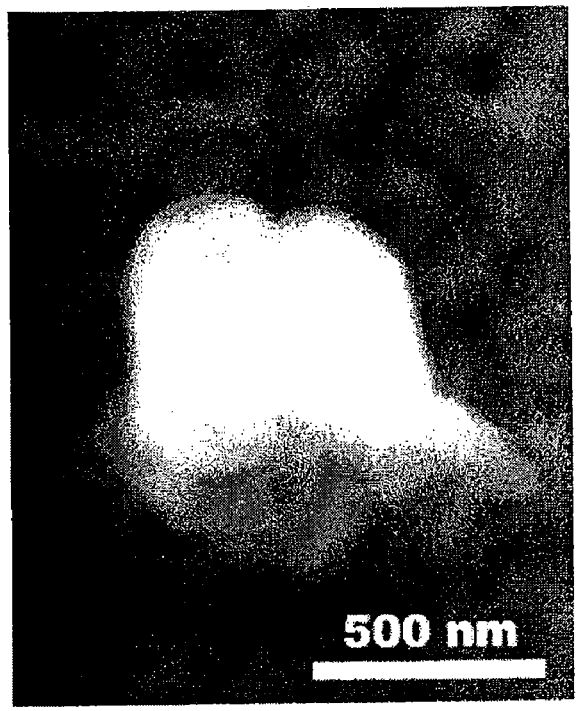
FIGS. 4a-4c illustrate SEM images of the final nanopipe structures.
Figure 4B:
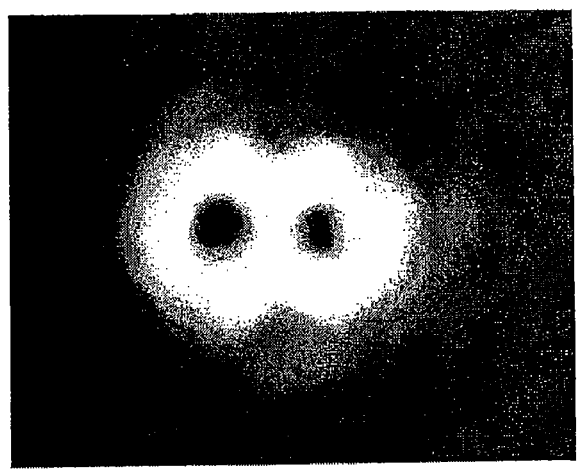
Figure 4C:
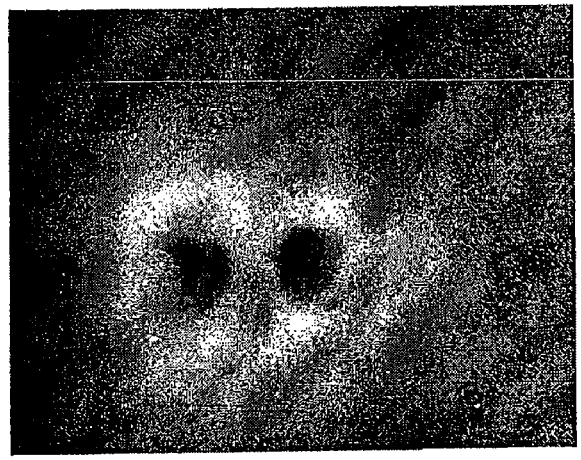

Finally, the openings 110 through the silicon nitride membrane were produced by exposing the chip to $SF_6/O_2$-based plasma etch, with the newly formed nanopipes serving as a mask thereby assuring self-alignment of the backside holes with the nanopipes (see FIG. 1i). In more detail, the openings 110 through the silicon nitride membrane were produced by exposing the chip to $SF_6/O_2$ RIE for 5 min with nanopipes serving as patterned mask (see again FIG. 1i). This step essentially can be the last step in the fabrication process. If the internal diameter of the nanopipes is desirable to be much smaller an additional PECVD silicon dioxide can be deposited conformally over the structures. The SEM images of the final structure are presented in FIG. 4.

To produce structures presented in this paper the catalyst dot size was larger that 400 nm in diameter due to the limitations of electron beam lithography tool used, thus multiple fibers (2-3) were produced on each dot (see FIG. 2)[3]. The invention is not limited to the use of relatively coarse resolution electron beam lithography to define the catalyst particle(s), or even to the use of electron beam lithography, and the invention can include the utilization of individual deterministically located and orientated elongated nanostructures based on the use of smaller catalyst dot sizes. In this regard, please see U.S. Pat. No. 6,649,431, issued Nov. 18, 2003; U.S. Pat. No. 6,692,324 issued Feb. 17, 2004; 10/715,057, filed Nov. 17, 2003; 09/964,270, filed Sep. 26, 2001; 10/068,795, filed Feb. 6, 2002; 10/155,841, filed May 24, 2002; 10/681,565, filed Oct. 8, 2003; 10/408,294, filed Apr. 7, 2003 and 10/716,770, filed Nov. 19, 2003.

Figure 5A:
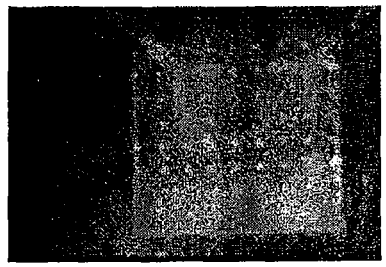
FIGS. 5a-5i illustrate observation of fluidic transport through nanopipe membranes by diffusive mixing and electrokinetic interaction of two membrane-isolated solutions (propidium iodide and DNA); upon interaction, the propidium iodide fluorescence increases dramatically as it intercalates with the DNA.

The functionality of nanopipes has been demonstrated by observing fluidic transport between two fluid regions that were physically separated by a membrane containing the nanopipe pores. To observe fluid transport, the inventors exploited the fluorogenic property of propidium iodide (PI), a nucleic acid stain that is fluorescently enhanced by a factor of 20-30 upon its intercalation between the bases of double stranded DNA. By placing a solution of this dye on one side of the nanopipe membrane, and a solution of double-stranded DNA on the opposing side, the transport of material through the pipe could be observed by an enhanced fluorescent response in the regions where the fluids mixed. To enable visualization of this interaction using fluorescence microscopy, a fixture was fabricated that elevated the nanopipe membrane approximately 1 mm above the surface of a glass microscope slide. Approximately 10 µl of the two solutions (6 µM propidium iodide and 0.5 µg/µl plasmid DNA—pgreen-lantern-1) was then placed on the top (propidium iodide) and bottom (DNA) surfaces of the membrane, respectively, carefully ensuring there was no mixture of fluids during dispensing. The DNA solution tended to capillary wick between the glass microscope slide and the nanopipe membrane, but was unable to interact with the PI solution about the membrane periphery. The hydrophobicity of the membrane surface helped retain the PI solution as a discrete drop of fluid on the top of the membrane. Prior to loading the dry nanopipe array was imaged in transmission mode using white light illumination (see FIG. 5a).

Figure 5B:
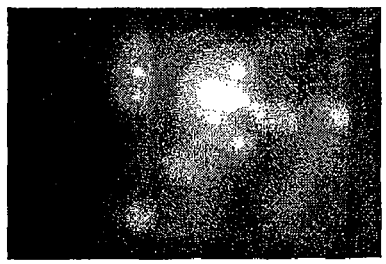
Figure 5C:
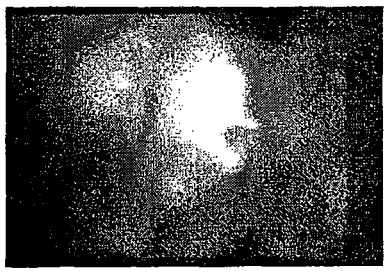
Figure 5D:
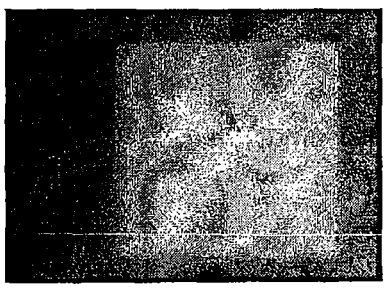

After loading, the diffusive transport of material between the two solutions was observed using two-dimensional images acquired with an optical microscope with an epi-fluorescence attachment (Eclipse TE300, Nikon, Melville, N.Y.), a cooled CCD camera (TEA/CCD-770-EM1, Princeton Instruments, Trenton, N.J.) and a TRITC filter set (545 nm excitation/620 nm emission). Immediately upon loading, plumes of fluorescence could be observed in the DNA solution at some of the nanopipe positions as propidium iodide diffused through the nanopipes and intercalated into the plasmid DNA (see FIGS. 5b and 5c). After a few minutes these plumes tended to decrease and stop (see FIG. 5d), possibly due to the large structure of the plasmid tending to diffuse into and clog the nanoscale pipe pores. Over time, the fluorescence at the pipe positions was noted to increase, perhaps indicative of the presence of increasing amounts of propidium iodide-stained DNA within the nanopipe.

Figure 5E:
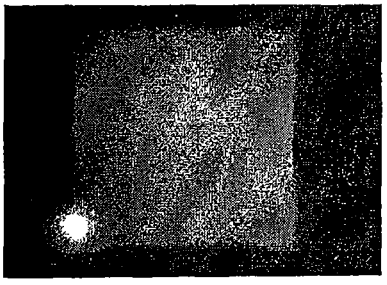
Figure 5F:
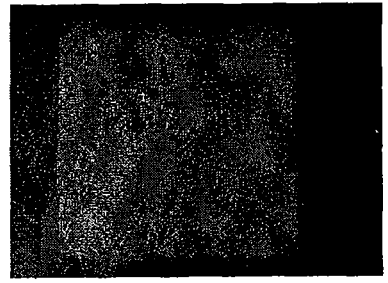
Figure 5G:
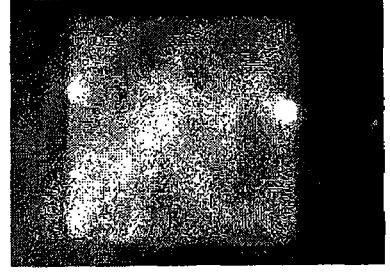
Figure 5H:
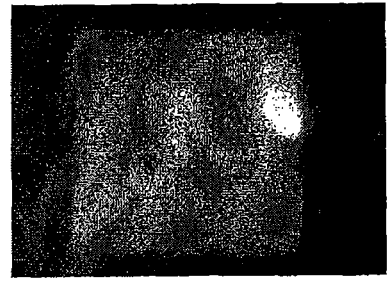
Figure 5I:
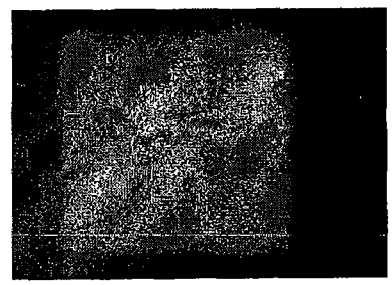

Following demonstration of diffusive transport between the propidium iodide and DNA solutions, the fixture was modified to enable electrical connection to the fluid droplets on either side of the nanopipe membrane. To connect to the DNA solution, a gold electrode (1000 A) was sputtered onto the microscope slide (buffered with a 500 A layer of chrome), enabling electrical interfacing to the solution but positioned to not block optical access to the nanopipe membrane from below. A 20 mil platinum wire was placed in the PI solution. Voltages were applied between the two solutions, with the positive electrode in the propidium iodide solution and the negative electrode in the DNA solution. Under these conditions, there will be electrophoretic mobility of the propidium ion (positively charged) towards the negative electrode in the DNA solution as well as DNA (negatively charged phosphate backbone) migration to the positive electrode in the propidium iodide solution. Further, as the nanopipe is composed of silica, the negative surface charges on the silica will support electroosmotic flow (see for example reference 15) due to cation stacking and their subsequent migration towards the negative electrode in the DNA solution. The fixture was mounted on the fluorescent microscope platform and solutions were applied as described above. Following initial plume formation due to diffusive transport (see FIG. 5e), the plumes dispersed, and no additional plume formation was observed (see FIG. 5f). Application of a 5V potential between the two fluids resulted in the sudden generation of a large plume from a few nanopipes (see FIGS. 5g and 5h) that subsided after about 5 min (see FIG. 5i). Both the diffusive- and electrokinetically-induced plume generation could be reproduced after thorough rinsing of the device in nanopure water.

Nanoreplication (Secondary Templates)

The use of nanopipes as secondary templates is described below. In this particular embodiment, nanopipes are fabricated on a conductive substrate and then filled with metal using electroplating.

The nanopipe fabrication/filling process for this purpose is depicted in FIGS. 6a-6g. The VACNF catalyst particles 610 were deposited on a Si (silicon) substrate 620 using a lift off process (see FIG. 6a). Electron beam resist, poly(methyl methocrylate) (PMMA), was spun on the top surface and patterns were exposed. The size of the exposed dots was chosen to be 100 nm in diameter to produce isolated VACNFs. The exposures were developed in a solution of MIBK: isopropanol 1:1 for 1 min, rinsed in isopropanol and blown dry with nitrogen. The Ti buffer layer 630 (10 nm) and catalyst metal 610 (Ni, 10 nm) were deposited by electron gun physical vapor deposition (PVD). The resist was then dissolved in acetone so that the metal remained only on the exposed areas. The VACNFs 640 were grown (see FIG. 6b) in a glow discharge dc plasma of ammonia/acetylene (80 sccm/40 sccm) gas mixture at 700° C., with 2.5 Torr total pressure and 150 mA dc current. Carbonatious species decompose at the surface of the Ni particle, free carbon diffuses through this particle, and is deposited on the bottom surface of the catalyst as described previously[13]. Since the synthesis is catalytically controlled, a VACNF emerges only at the positions where the catalyst was placed. The resultant isolated VACNF and a dense forest of VACNFs grown from unpatterned catalyst are shown in FIG. 7a and FIG. 7b, respectively.

Figure 8A:
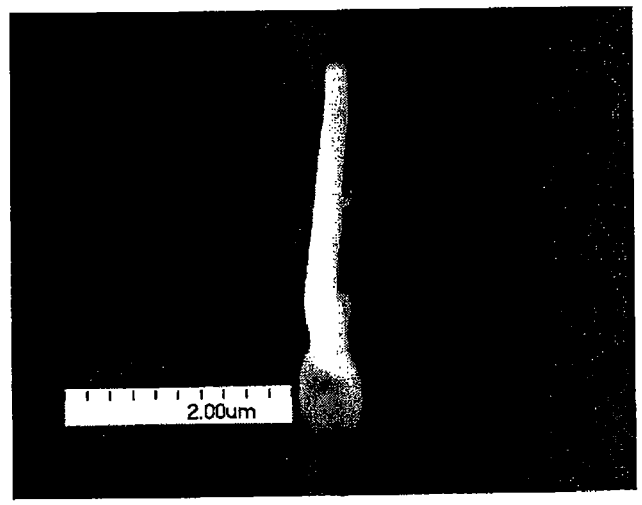
FIGS. 8a-8d illustrate SEM images of nanopipes at various steps during the fabrication process.
Figure 8B:
Figure 8C:
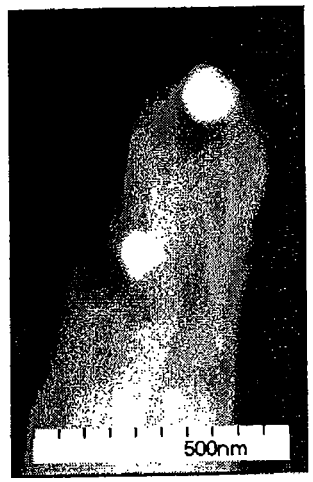

In the next step (see FIG. 6c) the nanofibers 640 and the surface of the chip were coated with 100-nm-thick layer of $SiO_2$ 650 using a silane-based PECVD process to form the walls of the nanopipes. SEM images of encapsulated nanofibers are shown in FIGS. 8a and 8b. To open the tips of the nanopipes, resist 660 was spun over the surface of the chip (Shipley, Microposit 1818) and its thickness was adjusted by reactive ion etching (RIE) in oxygen plasma to uncover the tips of the nanopipe structures (see FIG. 6d). The silicon oxide was removed from exposed areas using RIE in $CHF_3/O_2$ RF plasma (see FIG. 6e). The resist was then dissolved in acetone or, alternatively, etched in RIE oxygen-based plasma. The latter method is preferable since it uncovered the catalyst particle from the carbon film that covered it after VACNF growth. A small amount of the top portion of the carbon nanofiber was etched directly under the catalytic particle (see FIG. 8c) during this RIE step, but VACNF etching did not continue with increased etch time. Thus, this step was followed by a 1 min dip in nitric acid to remove the Ni particle that blocked access of enchant species (oxygen radicals) to the body of the VACNF (see FIG. 6f).

Figure 6A:
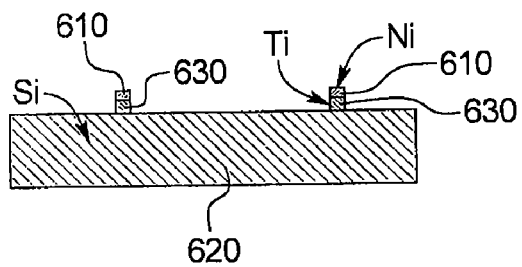
FIGS. 6a-6g illustrate steps for fabrication of isolated nanopipes.
Figure 6B:
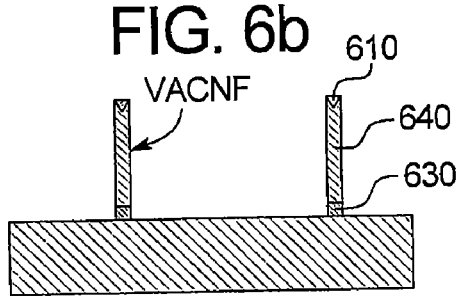
Figure 6C:
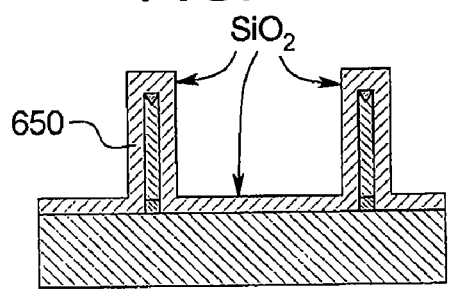
Figure 6D:
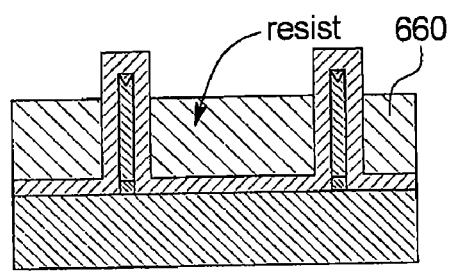
Figure 6E:
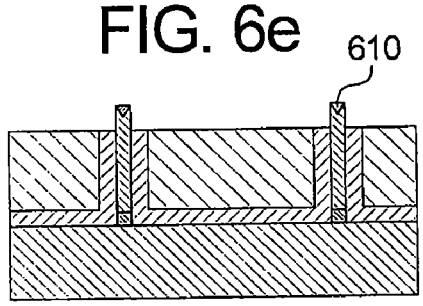
Figure 6F:
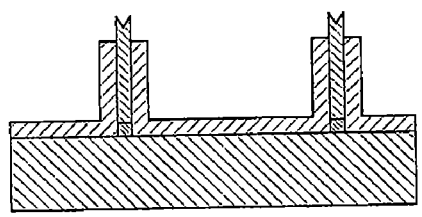
Figure 6G:
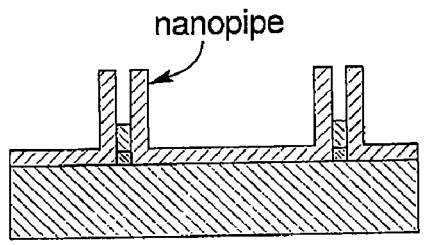
Figures 7A, 7B:
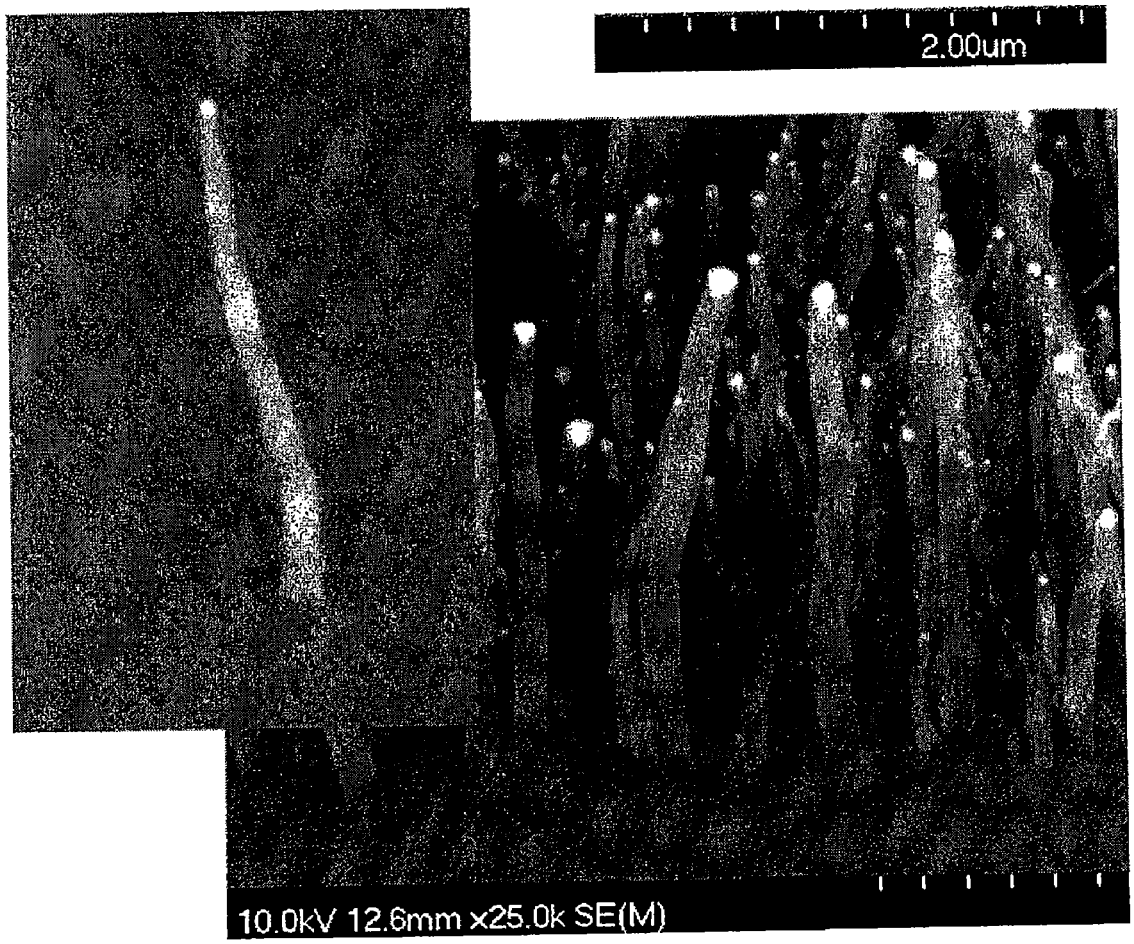
FIGS. 7a-7b illustrate SEM images of an isolated and a dense forest of VACNF grown from unpatterned catalyst (viewed at 30°); the bright spots are Ni particles, representing an embodiment of the invention.
Figure 8D:
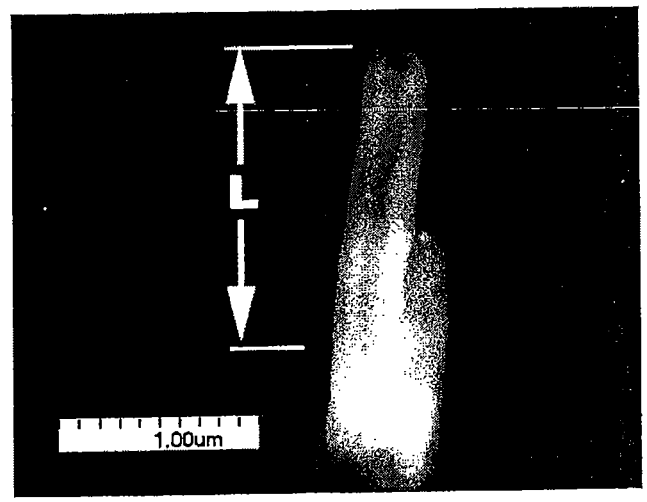
Figure 9:
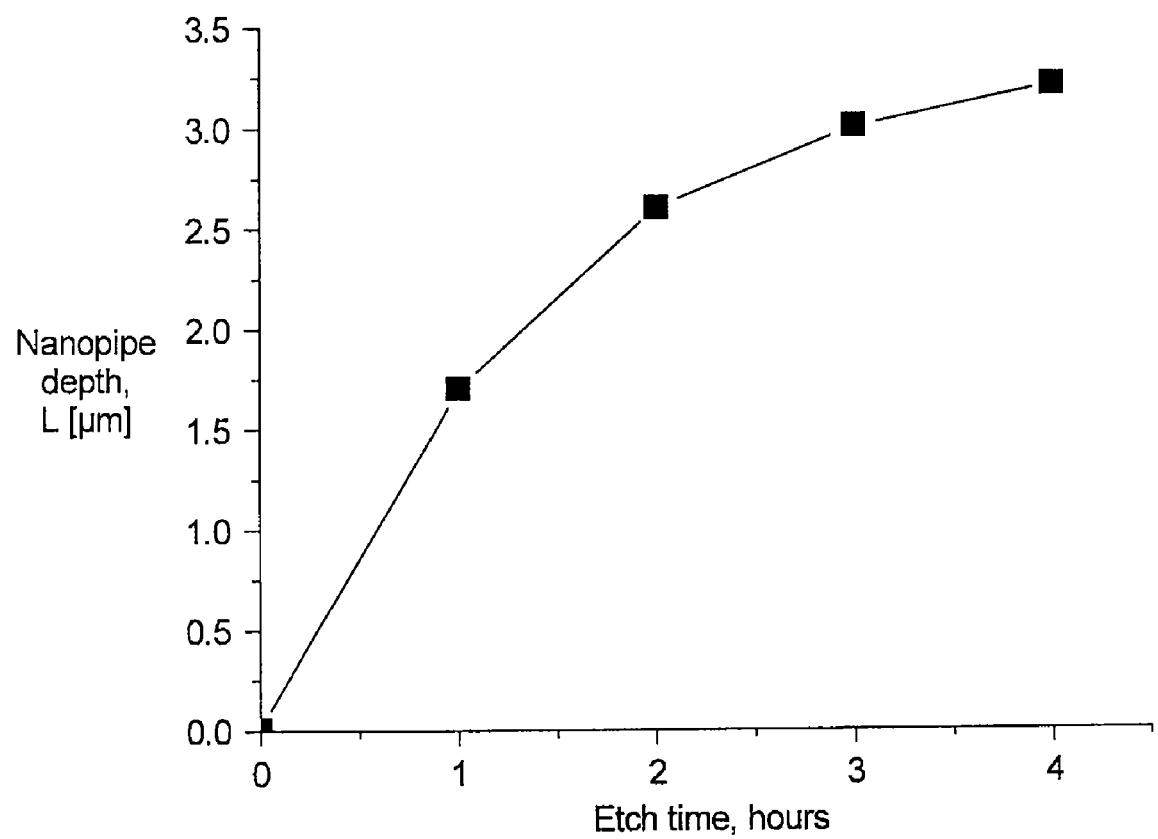
FIG. 9 illustrates the depth of the nanopipes versus etching time, representing an embodiment of the invention.

With this access to the VACNF provided, subsequent RIE in an oxygen plasma produced nanopipes (see FIG. 6g and FIG. 8d). The etching rate depended on the diameter of the nanofiber since a smaller diameter nanopipe was more restrictive to diffusive access of etchant species. Likewise, the etching rate strongly decreased with time due to increased nanopipe depth (see FIG. 9). This effect ultimately limits the length of the possible nanopipe structures made using reactive ion etching. Other methods of carbon oxidation and removal can provide alternative approaches to produce higher aspect ratio nanopipes.

Figure 10:
FIG. 10 illustrates an SEM image of the nanopipes with gold electroplated inside (viewing angle is 30°); the large gold cluster in the center is above a completely filled nanopipe, representing an embodiment of the invention.

To demonstrate utilization of the nanopipes as a secondary template, the inventors reduced Au from electroplating solution (Orotherm H T, Technic, Inc) inside the nanopipes to form Au nanowires. A Pt wire dipped into solution above the structures served as the counter electrode, and the remains of the carbon nanofibers at the bottom of the nanopipes were the cathodes contacted in parallel through the Si substrate. In order to remove air bubbles from the nanopipes, the sample was soaked and refrigerated in electroplating solution for an hour. One-micron long nanowires (the bright rods in FIG. 10) were formed after plating for one hour at 60° C. with −1 V on the anode and current compliance of the reducing voltage power supply set to 1 µA. The large cluster of gold in FIG. 10 was formed quickly after one of the nanopipes was completely filled and electroplating was no longer diffusion limited. The limited access of gas or liquid to the interior of the nanopipes may be used to advantage. For example, the rate of the metal electrodeposition inside the nanopipe is much smaller than that at open tip nanostructures, and consequently can be more precisely controlled. The inventors have observed that the rate of gold electroplating inside the nanopipes (FIG. 10) is at least two orders of magnitude slower than the rate at the exposed tip of the nanofiber electrochemical probe. Thus, varying electrodeposition duration can precisely control nanostructure formation within nanopipes.

Structures produced by metal electroplating within nanopipes templates may be used in several applications. The Au plating on probes may be used to exploit thiol chemistry in biosensing, electroplating of Ni or Fe may be useful to produce nanorods for magnetic applications (e.g. magnetic force microscopy tips, etc.), and nanowires of many types may find uses in electronics. The main advantage of this approach, compared for example to the use of porous membranes, is that the nanowires can be produced at any desired location due to the deterministic growth characteristics of VACNFs.

Practical Applications of the Invention

A practical application of the invention that has value within the technological arts is nanofabrication based upon the synthesis of sacrificial self-assembled nanostructures (VACNFs) grown at predetermined locations as templates for the formation of nanopipe structures. The nanopipes have functionality for diffusive and electrokinetic transport of small molecules as confirmed in the results described herein. Another practical application of the invention is in the context of high-throughput sensing and analysis of molecular species. Another practical application of the invention is in the context of fluidic interfaces to live cells. Further, the invention is useful to provide a nanofluidic interface between microfluidic channels, or to provide nozzles for ink-jets, or to provide inlets for high spatial resolution scanning gas sensors. There are virtually innumerable uses for the invention, all of which need not be detailed here.

Advantages of the Invention

A nanoconduit, representing an embodiment of the invention, can be cost effective and advantageous for at least the following reasons. The invention allows the determinstic location of an end of a nanoconduit with respect to a position (e.g. orifice) on a substrate. The invention allows the deterministic orientation of a nanoconduit with respect to a position on a substrate.

The invention allows the deterministic arrangement of a plurality of nanoconduits with respect to a plurality of positions on a substrate. The invention improves quality and/or reduces costs compared to previous approaches.

The terms a or an, as used herein, are defined as one or more than one. The term plurality, as used herein, is defined as two or more than two. The term another, as used herein, is defined as at least a second or more. The terms "comprising" (comprises, comprised), "including" (includes, included) and/or "having" (has, had), as used herein, are defined as open language (i.e., requiring what is thereafter recited, but open for the inclusion of unspecified procedure(s), structure(s) and/or ingredient(s) even in major amounts. The terms "consisting" (consists, consisted) and/or "composing" (composes, composed), as used herein, close the recited method, apparatus or composition to the inclusion of procedures, structure(s) and/or ingredient(s) other than those recited except for ancillaries, adjuncts and/or impurities ordinarily associated therewith. The recital of the term "essentially" along with the terms "consisting" or "composing" renders the recited method, apparatus and/or composition open only for the inclusion of unspecified procedure(s), structure(s) and/or ingredient(s) which do not materially affect the basic novel characteristics of the composition. The term coupled, as used herein, is defined as connected, although not necessarily directly, and not necessarily mechanically. The term any, as used herein, is defined as all applicable members of a set or at least a subset of all applicable members of the set. The term approximately, as used herein, is defined as at least close to a given value (e.g., preferably within 10% of, more preferably within 1% of, and most preferably within 0.1% of). The term substantially, as used herein, is defined as largely but not necessarily wholly that which is specified. The term generally, as used herein, is defined as at least approaching a given state. The term deploying, as used herein, is defined as designing, building, shipping, installing and/or operating. The term means, as used herein, is defined as hardware, firmware and/or software for achieving a result. The term program or phrase computer program, as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer or computer system.

All the disclosed embodiments of the invention disclosed herein can be made and used without undue experimentation in light of the disclosure. The invention is not limited by theoretical statements recited herein. Although the best mode of carrying out the invention contemplated by the inventor(s) is disclosed, practice of the invention is not limited thereto. Accordingly, it will be appreciated by those skilled in the art that the invention may be practiced otherwise than as specifically described herein.

It will be manifest that various substitutions, modifications, additions and/or rearrangements of the features of the invention may be made without deviating from the spirit and/or scope of the underlying inventive concept. It is deemed that the spirit and/or scope of the underlying inventive concept as defined by the appended claims and their equivalents cover all such substitutions, modifications, additions and/or rearrangements.

All the disclosed elements and features of each disclosed embodiment can be combined with, or substituted for, the disclosed elements and features of every other disclosed embodiment except where such elements or features are mutually exclusive. Variation may be made in the steps or in the sequence of steps defining methods described herein.

Although the nanoconduits, nanotransfers and/or nanoreplicants described herein can be a separate module, it will be manifest that the nanoconduits, nanotransfers and/or nanoreplicants may be integrated into the system with which it is (they are) associated.

The individual components need not be formed in the disclosed shapes, or combined in the disclosed configurations, but could be provided in all shapes, and/or combined in all configurations. The individual components need not be fabricated from the disclosed materials, but could be fabricated from all suitable materials. Homologous replacements may be substituted for the substances described herein. Agents which are chemically elated may be substituted for the agents described herein where the same or similar results would be achieved.

The appended claims are not to be interpreted as including means-plus-function limitations, unless such a limitation is explicitly recited in a given claim using the phrase(s) "means for" and/or "step for." Subgeneric embodiments of the invention are delineated by the appended independent claims and their equivalents. Specific embodiments of the invention are differentiated by the appended dependent claims and their equivalents.

REFERENCES

[1] Y. Huang, X. F. Duan, Y. Cui, L. J. Lauhon, K. H. Kim, and C. M. Lieber, Science 294, 1313 (2001).
[2] A. Bachtold, P. Hadley, T. Nakanishi, and C. Dekker, Science 294, 1317 (2001).
[3] V. I. Merkulov, D. H. Lowndes, Y. Y. Wei, G. Eres, and E. Voelkl, Applied Physics Letters 76, 3555 (2000).
[4] Z. F. Ren, Z. P. Huang, J. W. Xu, J. H. Wang, P. Bush, M. P. Siegal, and P. N. Provencio, Science 282, 1105 (1998).
[5] L. Deizeit, C. V. Nguyen, R. M. Stevens, J. Han, and M. Meyyappan, Nanotechnology 13, 280 (2002).
[6] M. Chhowalla, K. B. K. Teo, C. Ducati, N. L. Rupesinghe, G. A. J. Amaratunga, A. C. Ferrari, D. Roy, J. Robertson, and W. I. Milne, Journal of Applied Physics 90, 5308 (2001).
[7] M. A. Guillorn, T. E. McKnight, A. Melechko, V. I. Merkulov, P. F. Britt, D. W. Austin, D. H. Lowndes, and M. L. Simpson, Journal of Applied Physics 91, 3824 (2002).
[8] M. A. Guillorn, A. V. Melechko, V. I. Merkulov, E. D. Ellis, C. L. Britton, M. L. Simpson, D. H. Lowndes, and L. R. Baylor, Applied Physics Letters 79, 3506 (2001).
[9] C. K. Harnett, G. W. Coates, and H. G. Craighead, Journal of Vacuum Science & Technology B 19, 2842 (2001).
[10] J. Li, D. Stein, C. McMullan, D. Branton, M. J. Aziz, and J. A. Golovchenko, Nature 412, 166 (2001).
[11] T. Vo-Dinh, B. Cullum, and G. D. Griffin, Radiation Research 156, 437 (2001).
[12] C. R. Martin, Science 266, 1961 (1994).
[13] S. A. Miller, V. Y. Young, and C. R. Martin, Journal of the American Chemical Society 123, 12335 (2001).
[14] L. Sun and R. M. Crooks, Journal of the American Chemical Society 122, 12340 (2000).
[15] S. L. Zeng, C. H. Chen, J. C. Mikkelsen, and J. G. Santiago, Sensors and Actuators B-Chemical 79, 107 (2001).
[16] A. V. Melechko, T. E. McKnight, M. A. Guillorn, V. I. Merkulov, B. Ilic, J. J. Doktycz, D. H. Lowndes, and M. L. Simpson, Applied Physics Letters 82, No. 6, pages 976-978 (Feb. 10, 2003).
[17] P. Kim and C. M. Lieber, Science 286, 2148 (1999).
[18] V. I. Merkulov, A. V. Melechko, M. A. Guillorn, et al., Applied Physics Letters 79, 2970 (2001).

What is claimed is:

1. An apparatus, comprising:
   at least one nanopipe on a surface of a substrate; and
   a nanoreplicant structure comprising an elongated metal nanostructure disposed within the nanopipe,
   wherein the substrate includes at least one opening therethrough and the nanopipe is contiguous with the opening.

2. The apparatus of claim 1, wherein the elongated metal nanostructure is aligned non-parallel to a plane defined by the surface of the substrate.

3. The apparatus of claim 2, wherein the elongated metal nanostructure is aligned substantially perpendicular to the plane defined by the surface of the substrate.

4. The apparatus of claim 1, wherein the substrate includes silicon nitride.

5. The apparatus of claim 1, wherein the elongated metal nanostructure includes a substantially circular cross section.

6. The apparatus of claim 1, wherein the elongated metal nanostructure includes a non-circular cross section.

7. The apparatus of claim 1, wherein the elongated metal nanostructure comprises a metal selected from the group consisting of Au, Ni and Fe.

8. The apparatus of claim 1, wherein the elongated metal nanostructure completely fills the nanopipe.

9. The apparatus of claim 1, wherein the nanopipe comprises a material selected from the group consisting of $SiO_2$, $Si_3N_4$, and a metal.

10. The apparatus of claim 1, wherein the nanopipe has a length of up to several microns.

11. The apparatus of claim 1, wherein the nanopipe has an internal diameter in the range of from about 30 nm to about 200 nm.

12. The apparatus of claim 1, wherein the nanopipe has a wall thickness selected from 80 nm and 100 nm.

13. The apparatus of claim 1, comprising a plurality of the nanopipes on the surface.

14. The apparatus of claim 13, wherein the plurality of the nanopipes are arranged in an array.

15. The apparatus of claim 1, further comprising a plurality of the nanopipes on the surface and a plurality of the openings through the substrate, the nanopipes being contiguous with the openings.

16. The apparatus of claim 1, wherein the elongated nanostructure comprises a metal, and the nanopipe comprises a material selected from the group consisting of $SiO_2$, $Si_3N_4$, and a metal,
   wherein the elongated nanostructure is aligned non-parallel to a plane defined by the surface of the substrate, and the nanopipe has an internal diameter in the range of from about 30 nm to about 200 nm and a length of up to several microns, and
   further comprising a plurality of the nanopipes on the surface and a plurality of openings through the substrate, the nanopipes being contiguous with the openings.

* * * * *